(12) United States Patent
Wang et al.

(10) Patent No.: US 12,307,557 B2
(45) Date of Patent: May 20, 2025

(54) METHOD AND APPARATUS FOR RECONSTRUCTING MEDICAL IMAGE

(71) Applicant: SHENZHEN INSTITUTES OF ADVANCED TECHNOLOGY CHINESE ACADEMY OF SCIENCES, Guangdong (CN)

(72) Inventors: Shuqiang Wang, Guangdong (CN); Shengye Hu, Guangdong (CN); Zhuo Chen, Guangdong (CN); Yanyan Shen, Guangdong (CN)

(73) Assignee: SHENZHEN INSTITUTES OF ADVANCED TECHNOLOGY CHINESE ACADEMY OF SCIENCES, Guangdong (CN)

( * ) Notice: Subject to any disclaimer, the term of this patent is extended or adjusted under 35 U.S.C. 154(b) by 315 days.

(21) Appl. No.: 17/791,099

(22) PCT Filed: Mar. 17, 2020

(86) PCT No.: PCT/CN2020/079678
§ 371 (c)(1),
(2) Date: Jul. 6, 2022

(87) PCT Pub. No.: WO2021/184195
PCT Pub. Date: Sep. 23, 2021

(65) Prior Publication Data
US 2023/0032472 A1 Feb. 2, 2023

(51) Int. Cl.
*G06T 11/00* (2006.01)
*G06V 10/74* (2022.01)
(Continued)

(52) U.S. Cl.
CPC .......... *G06T 11/005* (2013.01); *G06T 11/008* (2013.01); *G06V 10/761* (2022.01);
(Continued)

(58) Field of Classification Search
CPC . G06T 11/005; G06T 11/008; G06T 2210/41; G06T 11/003; G06V 10/82;
(Continued)

(56) References Cited

U.S. PATENT DOCUMENTS

2018/0293713 A1\* 10/2018 Vogels .................... G06V 10/82
2019/0057507 A1\* 2/2019 El-Khamy .............. G06T 11/60
(Continued)

FOREIGN PATENT DOCUMENTS

| CN | 108537743 A | 9/2018 |
| CN | 109559358 A | 4/2019 |

(Continued)

OTHER PUBLICATIONS

International Search Report for International Application No. PCT/CN2020/079678; Date of Completion: Dec. 14, 2020; Date of Mailing: Dec. 23, 2020; 3 pages.
(Continued)

*Primary Examiner* — Bobbak Safaipour
*Assistant Examiner* — Michael Kim Maiden
(74) *Attorney, Agent, or Firm* — CANTOR COLBURN LLP (57) ABSTRACT

The present application provides a method and an apparatus for reconstructing a medical image, and a method and an apparatus for training a medical image reconstruction network. The method for training a medical image reconstruction network includes: performing feature coding extraction on a real image sample to obtain a feature coding vector of the real image sample; performing, through an image reconstruction network, image reconstruction based on the feature coding vector to obtain a first image, and performing image reconstruction based on a first hidden layer vector of the real image sample to obtain a second image; and performing, through an image discrimination network, image discrimi-
(Continued)

nation on the real image sample, the first image, and the second image, and optimizing the image reconstruction network according to an image discrimination result.

11 Claims, 5 Drawing Sheets

(51) Int. Cl.
  *G06V 10/774* (2022.01)
  *G06V 10/776* (2022.01)
  *G06V 10/82* (2022.01)
(52) U.S. Cl.
  CPC .......... *G06V 10/774* (2022.01); *G06V 10/776* (2022.01); *G06V 10/82* (2022.01); *G06T 2210/41* (2013.01)
(58) Field of Classification Search
  CPC ............. G06V 2201/03; G06V 10/761; G06V 33/5608; G01R 33/4806; G06N 3/045; G06N 3/094
  See application file for complete search history.

(56) References Cited

U.S. PATENT DOCUMENTS

| 2019/0057521 | A1* | 2/2019 | Teixeira | A61B 6/545 |
| 2021/0209464 | A1* | 7/2021 | Bala | G06F 18/23213 |

FOREIGN PATENT DOCUMENTS

| CN | 109685863 A | 4/2019 |
| CN | 110148194 A | 8/2019 |
| CN | 110490807 A | 11/2019 |
| WO | 2019169594 A1 | 9/2019 |

OTHER PUBLICATIONS

Translation of International Search Report for International Application No. PCT/CN2020/079678; Date of Completion: Dec. 14, 2020; Date of Mailing: Dec. 23, 2020; 2 pages.

Written Opinion for International Application No. PCT/CN2020/079678; Date of Completion: Dec. 16, 2020; Date of Mailing: Dec. 23, 2020; 3 pages.

\* cited by examiner

METHOD AND APPARATUS FOR RECONSTRUCTING MEDICAL IMAGE

CROSS-REFERENCE TO RELATED APPLICATIONS

This application is a U.S. National Stage of International Patent Application No. PCT/CN2020/079678 filed on Mar. 17, 2020. The aforementioned application is hereby incorporated by reference in its entirety.

TECHNICAL FIELD

The present application relates to the technical field of image processing, and more particularly to a method and an apparatus for reconstructing a medical image, and a method and an apparatus for training a medical image reconstruction network.

BACKGROUND

Functional magnetic resonance imaging (fMRI) is an emerging neuroimaging modality that uses magnetic resonance imaging to measure hemodynamic changes caused by neuronal activity. As a non-invasive technique, fMRI can pinpoint specific cortical regions of brain activity and capture changes in blood oxygen that reflect neuronal activity. However, due to the high cost of fMRI image acquisition and long scanning time, and some special patients cannot be scanned (for example, those with metal objects in the body cannot be scanned), the number of images that can be obtained is often limited in specific application scenarios, which greatly limits the number of images that can be obtained, and greatly restricts the application of artificial intelligence methods, such as deep learning that relies on a large amount of data, in the field of medical image analysis.

A promising solution is to use limited real image samples through existing artificial intelligence methods to learn to reconstruct corresponding medical images from Gaussian hidden layer vectors, so as to increase the sample size and support subsequent image analysis tasks. As a current generation model with better performance, the generative adversarial network has gradually become a research hotspot of deep learning, and has begun to be applied to the field of medical images.

Technical Problems

The conventional generative adversarial network can generate new images by leaning real data distribution, but also has the problems that the network training is difficult and it is not easy to achieve optimal convergence.

Technical Solutions

A first aspect of embodiments of the present application provides a method for training a medical image reconstruction network. The method comprises:
  performing feature coding extraction on a real image sample to obtain a feature coding vector of the real image sample;
  performing, through an image reconstruction network, image reconstruction based on the feature coding vector to obtain a first image, and performing image reconstruction based on a first hidden layer vector of the real image sample to obtain a second image; and
  performing, through an image discrimination network, image discrimination on the real image sample, the first image, and the second image, and optimizing the image reconstruction network according to an image discrimination result.

In an embodiment, the step of performing feature coding extraction on the real image sample to obtain the feature coding vector of the real image sample comprises:
  performing, through an image coding network, feature extraction on the real image sample to obtain the feature coding vector of the real image sample.

In an embodiment, the step of performing, through the image coding network, feature extraction on the real image sample to obtain the feature coding vector of the real image sample comprises:
  performing hierarchical feature extraction on the real image sample through a plurality of three-dimensional convolutional layers of the image coding network; and
  processing an extracted feature through a linear function to obtain the feature coding vector of the real image sample.

In an embodiment, the linear function is a piecewise linear function.

In an embodiment, the piecewise linear function is a ReLU function.

In an embodiment, the method further comprises:
  performing, through an encoded feature discrimination network, vector discrimination on the feature coding vector and the first hidden layer vector; and
  optimizing the image coding network based on a vector discrimination result.

In an embodiment, the step of optimizing the image coding network based on the vector discrimination result comprises:
  performing adversarial training on the image coding network based on the vector discrimination result.

In an embodiment, the step of performing the adversarial training on the image coding network based on the vector discrimination result comprises:
  calculating a voxel-by-voxel difference between the second image and the real image sample, and updating a network parameter of the image coding network by a gradient descent method until the voxel-by-voxel difference is smaller or equal to a preset threshold, so as to realize the training of the image coding network.

The voxel-by-voxel difference is a first loss function of the image coding network, and the first loss function is as follows:

$$L_C = E_{z_e}[C(z_e)] - E_{z_r}[C(z_r)],$$

in which, $L_C$ represents the first loss function, $z_e$ represents the feature coding vector, $z_r$ represents the first hidden layer vector, C represents the image coding network, and E represents a mathematical expectation.

In an embodiment, the step of optimizing the image reconstruction network according to the image discrimination result comprises:
  performing adversarial training on the image reconstruction network according to the image discrimination result.

In an embodiment, the step of performing the adversarial training on the image reconstruction network according to the image discrimination result comprises:
  determining a second loss function of the image reconstruction network according to the image discrimination result, a structural similarity metric loss function, and a perceptual metric loss function, updating the network parameter of the image reconstruction network by the gradient descent method, and training the image reconstruction network.

The second loss function is as follows:

$$L_G = -E_{z_e}[D(G(z_e))] - E_{z_r}[D(G(z_r))] + \lambda_1 L_{SSIM}(G(z_r), x_{real}) + \lambda_2 L_{perceptual}(G(z_r), x_{real}),$$

$$L_{SSIM} = E_{z_e}[C(z_e)] - E_{z_r}[C(z_r)],$$

$$L_{Perceptual}(G(z_r), x_{real}) = \|G(z_r) - x_{real}\|_2^2 + \sum_{h=1}^{H}\sum_{w=1}^{W} \phi(G(z_r)) - \phi(G(z_r))^2,$$

and $$L_D = E_{z_e}[D(G(z_e))] + E_{z_r}[D(G(z_r))] - 2E_{x_{real}}[D(x_{real})],$$

in which, $L_G$ represents the second loss function, $z_e$ represents the feature coding vector, $z_r$ represents the first hidden layer vector, C represents an image coding network, D represents the image discrimination network, G represents the image reconstruction network, E represents a mathematical expectation, $L_{SSIM}$ represents the structural similarity metric loss function, $L_{perceptual}$ represents the perceptual metric loss function, $X_{real}$ represents the real image, $\lambda_1$ and $\lambda_2$ represent weight coefficients, $\Phi$ represents a Gram matrix, and $L_D$ represents a loss function of the image discrimination network.

In an embodiment, the step of performing, through the image reconstruction network, image reconstruction based on the feature coding vector to obtain the first image, and performing image reconstruction based on the first hidden layer vector of the real image sample to obtain the second image, comprises:

inputting the feature coding vector and the first hidden layer vector into the image reconstruction network to obtain the first image and the second image; wherein convolutional layers of the image reconstruction network are three-dimensional separable convolutional layers with nearest neighbor upsampling.

A second aspect of embodiments of the present application provides a method for reconstructing a medical image. The method comprises:

acquiring a second hidden layer vector of an image to be reconstructed; and performing, through a trained image reconstruction network, image reconstruction on the image to be reconstructed.

A third aspect of embodiments of the present application provides an apparatus for training a medical image reconstruction network. The apparatus comprises:

a feature coding extraction module, configured for performing feature coding extraction on a real image sample to obtain a feature coding vector of the real image sample;

a first image reconstruction module, configure for performing, through an image reconstruction network, image reconstruction based on the feature coding vector to obtain a first image, and performing image reconstruction based on a first hidden layer vector of the real image sample to obtain a second image; and a first optimization module, configured for performing, through an image discrimination network, image discrimination on the real image sample, the first image, and the second image, and optimizing the image reconstruction network according to an image discrimination result.

A fourth aspect of embodiments of the present application provides an apparatus for training a medical image. The apparatus comprises:

a hidden layer vector acquisition module, configured for acquiring a second hidden layer vector of an image to be reconstructed; and a second image reconstruction module, configured for performing, through a trained image reconstruction network, image reconstruction on the image to be reconstructed.

A fifth aspect of embodiments of the present application provides a terminal device. The terminal device comprises: a memory, a processor, and computer-readable instructions stored in the memory and executable on the processor. The processor is configured to implement the following steps when executing the computer-readable instructions:

performing feature coding extraction on a real image sample to obtain a feature coding vector of the real image sample;

performing, through an image reconstruction network, image reconstruction based on the feature coding vector to obtain a first image, and performing image reconstruction based on a first hidden layer vector of the real image sample to obtain a second image; and performing, through an image discrimination network, image discrimination on the real image sample, the first image, and the second image, and optimizing the image reconstruction network according to an image discrimination result.

In an embodiment, the step of performing feature coding extraction on the real image sample to obtain the feature coding vector of the real image sample comprises:

performing, through an image coding network, feature extraction on the real image sample to obtain the feature coding vector of the real image sample.

In an embodiment, the processor is further configured to implement the following steps when executing the computer-readable instructions:

performing, through an encoded feature discrimination network, vector discrimination on the feature coding vector and the first hidden layer vector; and optimizing the image coding network based on a vector discrimination result.

A sixth aspect of embodiments of the present application provides a terminal device. The terminal device comprises: a memory, a processor, and computer-readable instructions stored in the memory and executable on the processor. The processor is configured to implement the following steps when executing the computer-readable instructions:

performing feature coding extraction on a real image sample to obtain a feature coding vector of the real image sample;

performing, through an image reconstruction network, image reconstruction based on the feature coding vector to obtain a first image, and performing image reconstruction based on a first hidden layer vector of the real image sample to obtain a second image; and performing, through an image discrimination network, image discrimination on the real image sample, the first image, and the second image, and optimizing the image reconstruction network according to an image discrimination result.

A seventh aspect of embodiments of the present application provides a computer-readable storage medium, storing computer-readable instructions, which, when executed by the processor, causes the processor to implement the following steps:

performing feature coding extraction on a real image sample to obtain a feature coding vector of the real image sample;

performing, through an image reconstruction network, image reconstruction based on the feature coding vector to obtain a first image, and performing image reconstruction based on a first hidden layer vector of the real image sample to obtain a second image; and performing, through an image discrimination network, image discrimination on the real image sample, the first image, and the second image, and optimizing the image reconstruction network according to an image discrimination result.

An eighth aspect of embodiments of the present application provides a computer-readable storage medium, storing computer-readable instructions, which, when executed by the processor, causes the processor to implement the following steps:

acquiring a second hidden layer vector of an image to be reconstructed; and performing, through a trained image reconstruction network, image reconstruction on the image to be reconstructed.

A ninth aspect of embodiments of the present application provides a computer program product, which, when being executed on a terminal device, causes the terminal device to implement the method of any one of the first aspect, or to implement the method of any one of the second aspect.

Beneficial Effects

In the embodiments of the present application, the feature coding extraction is performed on the real image sample to obtain the feature coding vector of the real image sample. Image reconstruction is performed through the image reconstruction network, based on the feature coding vector to obtain the first image, and image reconstruction is performed based on the first hidden layer vector of the real image sample to obtain the second image. Moreover, image discrimination is performed on the real image sample, the first image, and the second image through the image discrimination network, and the image reconstruction network is optimized according to the image discrimination result. The optimized image reconstruction network is used for the image reconstruction, which introduces prior knowledge guidance from real images into the generative adversarial network, such that the training of the image reconstruction network is stabilized, and it is easy to achieve optimal convergence, so as to solve the problem of difficult training existing in the generative adversarial network.

BRIEF DESCRIPTION OF THE DRAWINGS

In order to more clearly illustrate the technical solutions in the embodiments of the present application, the drawings that need to be used in the description of the embodiments or the prior art will be briefly described hereinbelow. Obviously, the accompanying drawings in the following description are only some embodiments of the present application. For those skilled in the art, other drawings can be obtained based on these drawings without creative work.

DETAILED DESCRIPTION OF THE EMBODIMENTS

In the following description, for purposes of explanation rather than limitation, specific details such as particular system architectures and techniques are set forth to provide a thorough understanding of embodiments of the present application. However, it shall be apparent to those skilled in the art that the present application may also be implemented in other embodiments that do not have these details. In other instances, detailed descriptions of well-known systems, apparatuses, circuits, and methods are omitted so as not to obscure the description of the present application with unnecessary details.

It is to be understood that, when used in this specification and the appended claims, the term "comprising" indicates the presence of the described feature, integer, step, operation, element and/or component, but does not exclude one or more other features, integers, steps, operations, elements, components, and/or sets thereof.

It will also be understood that, as used in this specification and the appended claims, the term "and/or" refers to any one or more combinations and all possible combinations of the associated listed items, and also inclusion of these combinations.

As used in the specification of this application and the appended claims, the term "if" may be contextually interpreted as "when" or "once" or "in response to determining" or "in response to detecting". Similarly, the phrases "if it is determined" or "if the [described condition or event] is detected" may be interpreted, depending on the context, to mean "once it is determined" or "in response to the determination" or "once the [described condition or event] is detected." or "in response to detection of the [described condition or event]".

In addition, in the description of the specification of the present application and the appended claims, the terms "first", "second", "third", etc. are only used to distinguish the description, and should not be construed as indicating or implying relative importance.

References in this specification to "one embodiment" or "some embodiments" and the like mean that a particular feature, structure, or characteristic described in connection with the embodiment is included in one or more embodiments of the present application. Thus, appearances of the phrases "in one embodiment," "in some embodiments," "in other embodiments," "in some other embodiments," etc. in different places in this specification are not necessarily all refer to the same embodiment, but mean "one or more but not all embodiments" unless specifically emphasized otherwise. The terms "including/comprising", "containing", "having" and variants thereof mean "including but not limited to" unless specifically emphasized otherwise.

Functional magnetic resonance imaging (fMRI) is an emerging neuroimaging modality that uses magnetic resonance imaging to measure hemodynamic changes caused by neuronal activity. As a non-invasive technique, fMRI can pinpoint specific cortical regions of brain activity and capture changes in blood oxygen that reflect neuronal activity. However, due to the high cost of fMRI image acquisition and long scanning time, and some special patients cannot be scanned (for example, those with metal objects in the body cannot be scanned), the number of images that can be obtained is often limited in specific application scenarios, which greatly limits the number of images that can be obtained, and greatly restricts the application of artificial intelligence methods, such as deep learning that relies on a large amount of data, in the field of medical image analysis.

A promising solution is to use limited real image samples through existing artificial intelligence methods to learn to reconstruct corresponding medical images from Gaussian hidden layer vectors, so as to increase the sample size and support subsequent image analysis tasks. As a generation model having better performance currently, the generative adversarial network is firstly proposed by Lan Goodfellow et al. in 2014, and can capture the potential distribution of real data through the generator, so as to achieve the purpose of generating real data distribution samples from the hidden layer space. Since then, the generative adversarial network has gradually become a research hotspot of deep learning and has been applied to various fields. In addition to reconstructing the original image from the hidden layer vector, another solution is to synthesize the medical image of one modality from the medical image of another modality, such as synthesizing the corresponding PET image from the CT image of the same patient. Many scholars have done a lot of work in this area. However, the solution of cross-modal synthesis requires a large amount of image data from another modality to train the model, and the diversity of the synthetic samples is limited. Therefore, the most concerned idea is still how to stably reconstruct the corresponding medical images from the hidden layer vectors.

Although in this method, the generative adversarial network can generate new images with diversity by learning the real data distribution, a biggest problem of the generative adversarial network is that network training is difficult and it is not easy to achieve optimal convergence. The purpose of the generative adversarial network is to make the data distribution fitted by the generator close to the real data distribution. During the research, the inventor of the present application found that the generative network without introduction of any prior knowledge does not know the real data distribution at all, and can only try again and again according to the true and false feedback of the discriminator. While as another powerful generative model, the variational auto-encoding network does not have such a problem. The variational auto-encoding network can firstly extract the encoded feature vector of the real image, and at the same time, perform variational inference through resampling, and decode the hidden vector according to the variational result.

Based on the inspiration of the action mechanism of the variational autoencoder, embodiments of the present application introduce the encoded feature vector of the variational autoencoder as a feature prior knowledge about the real image into the training of the generative adversarial network, which gives the generative network a clear optimization direction, so as to solve the problem that the generative adversarial network is difficult to train, time-consuming, and very easy to collapse. Moreover, we find that simply piecing together the variational autoencoder and the generative adversarial network is not enough, because an optimization conflict exists between the variational inference and the objective function of the generative adversarial network, and the two cannot achieve optimal convergence at the same time. In order to solve this problem, the present application further introduces a separate encoding discriminator, so that the optimization process of the variational autoencoder is also included in the "generative-adversarial" system, and the optimization conflict exists between the variational inference and the objective function of the generative adversarial network can be solved.

Figure 1:
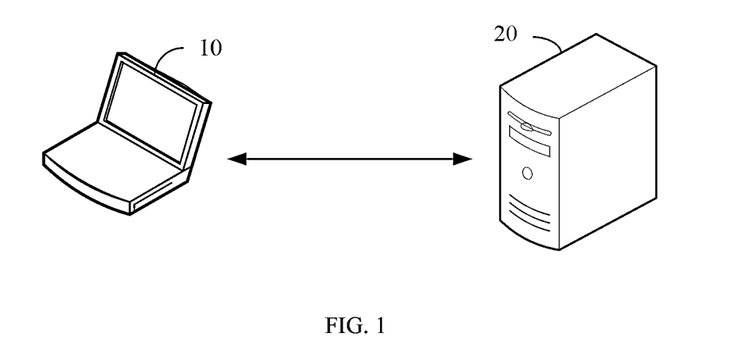
FIG. 1 is a schematic diagram of an application scenario provided by an embodiment of the present application.

For example, embodiments of the present application may be applied to the exemplary scenario shown in FIG. 1. A terminal 10 and a server 20 constitute the application scenarios of the above-mentioned method for training a medical image reconstruction network and a method for reconstructing a medical image.

Specifically, the terminal 10 is configured to obtain a real image sample being test, and send this real image sample to the server 20. The server is configured for: performing feature coding extraction on a real image sample to obtain a feature coding vector of the real image sample; performing, through an image reconstruction network, image reconstruction based on the feature coding vector to obtain a first image, and performing image reconstruction based on a first hidden layer vector of the real image sample to obtain a second image; and performing, through an image discrimination network, image discrimination on the real image sample, the first image, and the second image, and optimizing the image reconstruction network according to an image discrimination result. The optimized image reconstruction network is used for the image reconstruction, which introduces prior knowledge guidance from real images into the generative adversarial network, such that the training of the image reconstruction network is stabilized, and it is easy to achieve optimal convergence, so as to solve the problem of difficult training existing in the generative adversarial network.

A method for training a medical image reconstruction network provided by the present application is described hereinbelow in detail in combination with FIG. 1.

Figure 2:
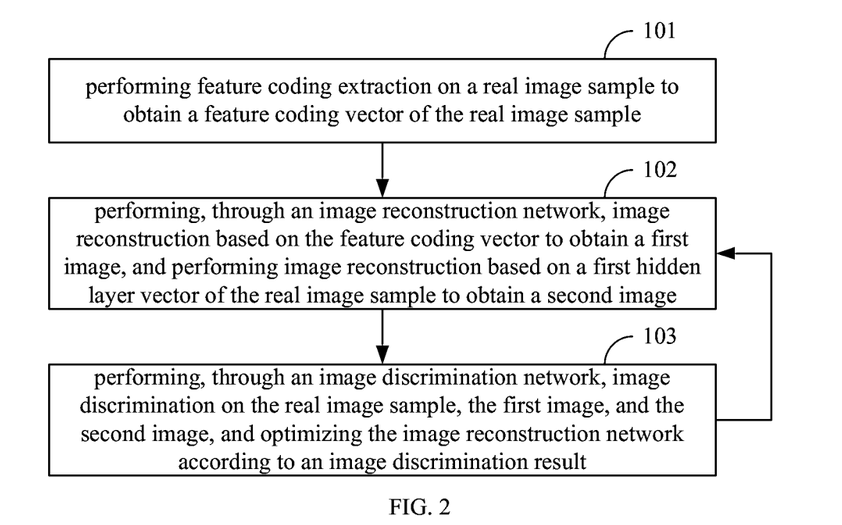
FIG. 2 is a schematic flowchart of a method for training a medical image reconstruction network provided by an embodiment of the present application.

FIG. 2 is a schematic flowchart of a method for training a medical image reconstruction network provided by an embodiment of the present application. As shown in FIG. 2, The method for training a medical image reconstruction network is described in detail as follows:

In step 101, feature coding extraction is performed on a real image sample to obtain a feature coding vector of the real image sample.

In an embodiment, step 101 can be implemented by performing, through an image coding network, feature extraction on the real image sample to obtain the feature coding vector of the real image sample.

Figure 3:
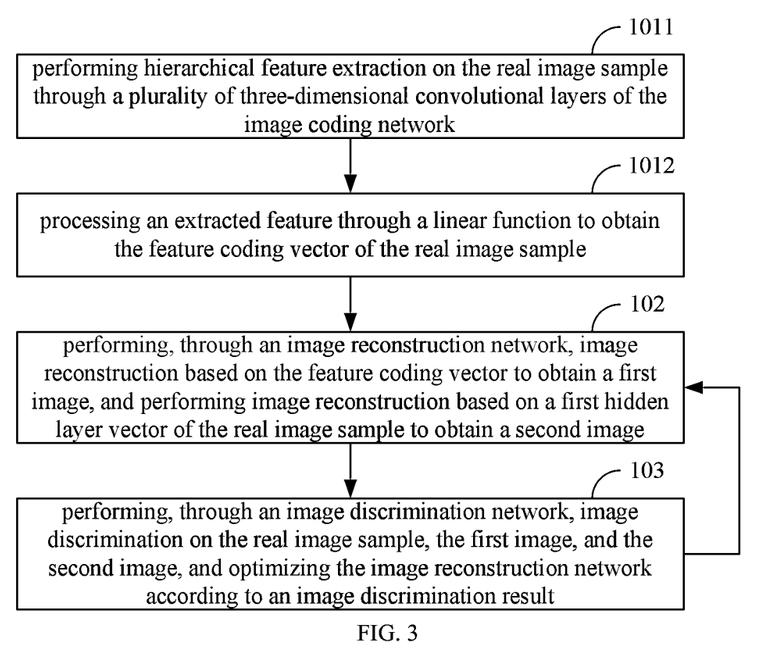
FIG. 3 is a schematic flowchart of a method for training a medical image reconstruction network provided by another embodiment of the present application.

Exemplarily, as shown in FIG. 3, the step of performing, through the image coding network, feature extraction on the real image sample to obtain the feature coding vector of the real image sample, can specifically comprise: step 1011 and step S1012.

In step 1011, hierarchical feature extraction is performed on the real image sample through a plurality of three-dimensional convolutional layers of the image coding network.

In step 1012, an extracted feature is processed through a linear function to obtain the feature coding vector of the real image sample.

In an exemplary scene, the real image sample can be expanded into three-dimensional images in a time series, and the three-dimensional images are sequentially input into the image coding network. The three-dimensional images are performed with hierarchical feature extraction by using a plurality of three-dimensional convolutional layers of the image coding network, the linear feature and nonlinear feature of the three-dimensional images are synthesized by a linear function, and a feature coding representation vector of the real image sample is obtained.

The linear function is a piecewise linear function. Specifically, linear features and non-linear features of the three-dimensional image are processed by the linear function, to obtain a feature coding representation vector of the real image sample.

For example, the piecewise linear function is a ReLU function. Specifically, the linear features and non-linear features of the three-dimensional images are processed by the ReLU function, so as to obtain the feature coding representation vector.

In step 102, image reconstruction is performed through an image reconstruction network, based on the feature coding vector to obtain a first image, and image reconstruction is performed based on a first hidden layer vector of the real image sample to obtain a second image.

In an embodiment, the feature coding vector and the first hidden layer vector are input into the image reconstruction network to obtain the first image and the second image. Herein, the convolutional layers of the image reconstruction network are three-dimensional separable convolutional layers with nearest neighbor upsampling.

Exemplarily, the feature coding vector extracted from the real image sample and the first hidden layer vector sampled from a Gaussian distribution are used as inputs into the image reconstruction network, and the first image and the second image are obtained respectively from the feature coding vector and the first hidden layer vector by step-by-step reconstruction. In this embodiment, the three-dimensional separable convolutional layers with nearest neighbor upsampling are used to replace the deconvolutional layers in the traditional image reconstruction network, which can reduce the number of learnable parameters and improve the quality of the generated fMRI image, so that the reconstruction image has fewer artifacts, clearer structures, etc.

In step 103, image discrimination is performed on the real image sample, the first image, and the second image through an image discrimination network, and the image reconstruction network is optimized according to an image discrimination result.

Specifically, the real image sample, the first image, and the second image are used as inputs of the image discrimination network, and the image reconstruction network is optimized according to the image discrimination result of the image discrimination network, to construct "generative-adversarial" training, and the optimized trained image reconstruction network is used for image reconstruction.

After the image reconstruction network is optimized in step 103, the optimized image reconstruction network is continued to be used in the image reconstruction in step 102 to obtain the first image and the second image, and after the first image and the second image are obtained, the step 103 is executed again, and the cycle is executed in this way.

In the above method for training the medical image reconstruction network, the feature coding extraction is performed on the real image sample to obtain the feature coding vector of the real image sample. Image reconstruction is performed through the image reconstruction network, based on the feature coding vector to obtain the first image, and image reconstruction is performed based on the first hidden layer vector of the real image sample to obtain the second image. Moreover, image discrimination is performed on the real image sample, the first image, and the second image through the image discrimination network, and the image reconstruction network is optimized according to the image discrimination result. The optimized image reconstruction network is used for the image reconstruction, which introduces prior knowledge guidance from real images into the generative adversarial network, such that the training of the image reconstruction network is stabilized, and it is easy to achieve optimal convergence, so as to solve the problem of difficult training existing in the generative adversarial network.

Figure 4:
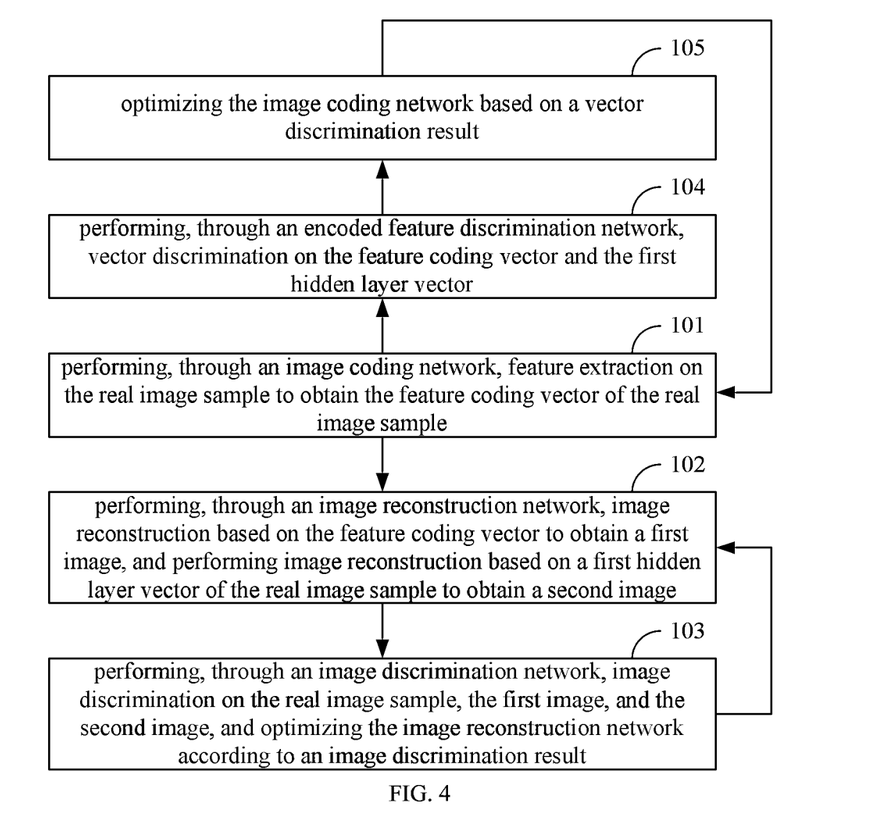
FIG. 4 is a schematic flowchart of a method for training a medical image reconstruction network provided by still another embodiment of the present application.

FIG. 4 is a schematic flowchart of a method for training a medical image reconstruction network provided by an embodiment of the present application. As shown in FIG. 4, based on the embodiment as shown in FIG. 2, the method for training the medical image reconstruction network further comprises: step 104 and step 105.

In step 104, vector discrimination is performed on the feature coding vector and the first hidden layer vector through an encoded feature discrimination network.

In step 105, the image coding network is optimized based on a vector discrimination result.

After the feature coding vector is obtained from step 101, the feature coding vector and the first hidden vector of the real image sample are further used to optimize the feature coding network in steps 104 and 105, and the optimized feature coding network is then used as the feature coding network in step 101 for further executing the step 101. In this way, the image coding network is repeatedly optimized.

In an embodiment, adversarial training is performed on the image coding network based on the vector discrimination result, such that the image coding network is optimized.

Specifically, an encoded feature discrimination network having the same structure as the image discrimination network can be established, and the feature coding vector encoded from the real image sample and the first hidden layer vector sampled from the Gaussian distribution are used as inputs of the encoded feature discrimination network, such that the encoded feature discrimination network and the image coding network also form the "generative-adversarial" training relationship, so as to replace the variational inference and solve the training conflict between the variational inference and the generative adversarial objective function.

In an embodiment, the step of performing the adversarial training on the image coding network based on the vector discrimination result specifically comprises: calculating a voxel-by-voxel difference between the second image and the real image sample, and updating a network parameter of the image coding network by a gradient descent method until the voxel-by-voxel difference is smaller or equal to a preset threshold, so as to realize the training of the image coding network. Herein, the voxel-by-voxel difference is a first loss function of the image coding network.

Exemplarily, the encoded feature discrimination network is introduced during the training and optimization of the image coding network, so as to replace the conventional variational interference process. During the training and optimization of the image coding network, a voxel-by-voxel difference between the reconstructed fMRI image and the real fMRI image is firstly calculated, a network parameter of the image coding network is updated by a gradient descent method until the voxel-by-voxel difference is smaller or equal to the preset threshold. Thereafter, the Wasserstein distance is selected as a measurement tool of the real image distribution and the reconstructed image distribution in the first loss function, and a gradient penalty term is introduced to crop a discriminator network gradient to further stabilize the network training.

Exemplarily, the first loss function is as follows:

$$L_C = E_{z_e}[C(z_e)] - E_{z_r}[C(z_r)],$$

in which, $L_C$ represents the first loss function, $z_e$ represents the feature coding vector, $z_r$ represents the first hidden layer vector, C represents the image coding network, and E represents a mathematical expectation.

In an embodiment, the step 103 of optimizing the image reconstruction network according to the image discrimination result can specifically comprise: performing adversarial training on the image reconstruction network according to the image discrimination result.

the step of performing the adversarial training on the image reconstruction network according to the image discrimination result can comprise: determining a second loss function of the image reconstruction network according to the image discrimination result, a structural similarity metric loss function, and a perceptual metric loss function, updating the network parameter of the image reconstruction network by the gradient descent method, and training the image reconstruction network.

Exemplarily, for the step of performing adversarial training on the image reconstruction network according to the image discrimination result, in particular, if the discrimination result from the image discrimination network is closer to the real image, then, it is only required to update the network parameter of the image reconstruction network with a first preset amplitude by the gradient descent method or not to update the network parameter of the image reconstruction network; and if the discrimination result from the image discrimination network is closer to the reconstruction image, then, it is require to update the network parameter of the image reconstruction network with a second preset amplitude, in which, the second preset amplitude is greater than the first preset amplitude. Moreover, in addition to select the Wasserstein distance as a measurement tool of the real image distribution and the reconstructed image distribution in the second loss function, a structural similarity metric loss and a perceptual metric loss are further introduced, so as to ensure that features of the reconstructed image are more consistent with those of the real image.

Exemplarily, the second loss function is as follows:

$$L_G = -E_{z_e}[D(G(z_e))] - E_{z_r}[D(G(z_r))] + \lambda_1 L_{SSIM}(G(z_r), x_{real}) + \lambda_2 L_{perceptual}(G(z_r), x_{real}),$$

$$L_{SSIM} = E_{z_e}[C(z_e)] - E_{z_r}[C(z_r)],$$

$$L_{Perceptual}(G(z_r), x_{real}) = \|G(z_r) - x_{real}\|_2^2 + \sum_{h=1}^{H}\sum_{w=1}^{W} \phi(G(z_r)) - \phi(G(z_r))^2,$$

and $$L_D = E_{z_e}[D(G(z_e))] + E_{z_r}[D(G(z_r))] - 2E_{x_{real}}[D(x_{real})],$$

in which, $L_G$ represents the second loss function, $z_e$ represents the feature coding vector, $z_r$ represents the first hidden layer vector, C represents an image coding network, D represents the image discrimination network, G represents the image reconstruction network, E represents a mathematical expectation, $L_{SSIM}$ represents the structural similarity metric loss function, $L_{perceptual}$ represents the perceptual metric loss function, $X_{real}$ represents the real image, $\lambda_1$ and $\lambda_2$ represent weight coefficients, $\Phi$ represents a Gram matrix, and $L_D$ represents a loss function of the image discrimination network.

In this embodiment, the proximity between the reconstructed image reconstructed by the reconstruction network and the real image can be evaluated by the image overlap ratio (SOR) technical indicator. After the training and optimization of the image reconstruction network is completed, high-quality medical image samples can be reconstructed from the Gaussian hidden layer vector through the trained image reconstruction network, which enhances the amount of image samples and facilitates subsequent analysis work.

Hereinbelow, the method for reconstructing a medical image of the present application will be described in detail with reference to FIG. 1.

Figure 5:
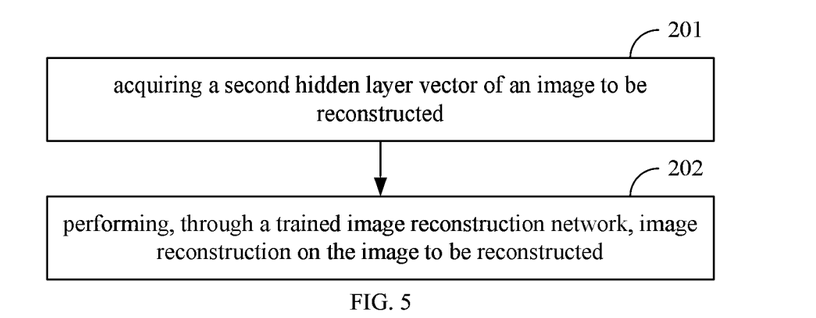
FIG. 5 is a schematic flowchart of a method for reconstructing a medical image provided by an embodiment of the present application.

FIG. 5 is a schematic flowchart of a method for reconstructing a medical image provided by an embodiment of the present application. As shown in FIG. 5, the method for reconstructing the medical image comprises steps 201 and step 202.

In step 201, a second hidden layer vector of an image to be reconstructed is acquired.

In step 202, image reconstruction is performed on the image to be reconstructed through a trained image reconstruction network.

In the above method for reconstructing the medical image, the feature coding extraction is performed on the real image sample to obtain the feature coding vector of the real image sample. Image reconstruction is performed through the image reconstruction network, based on the feature coding vector to obtain the first image, and image reconstruction is performed based on the first hidden layer vector of the real image sample to obtain the second image. Moreover, image discrimination is performed on the real image sample, the first image, and the second image through the image discrimination network, and the image reconstruction network is optimized and trained according to the image discrimination result. The image reconstruction network after being optimized and trained is used to perform the image reconstruction on the image to be constructed based on the second hidden layer vector, in this way, prior knowledge guidance from real images is introduced into the generative adversarial network, such that the training of the image reconstruction network is stabilized, and it is easy to achieve optimal convergence, so as to solve the problem of difficult training existing in the generative adversarial network, and the reconstructed image is more close to the real image.

Figure 6:
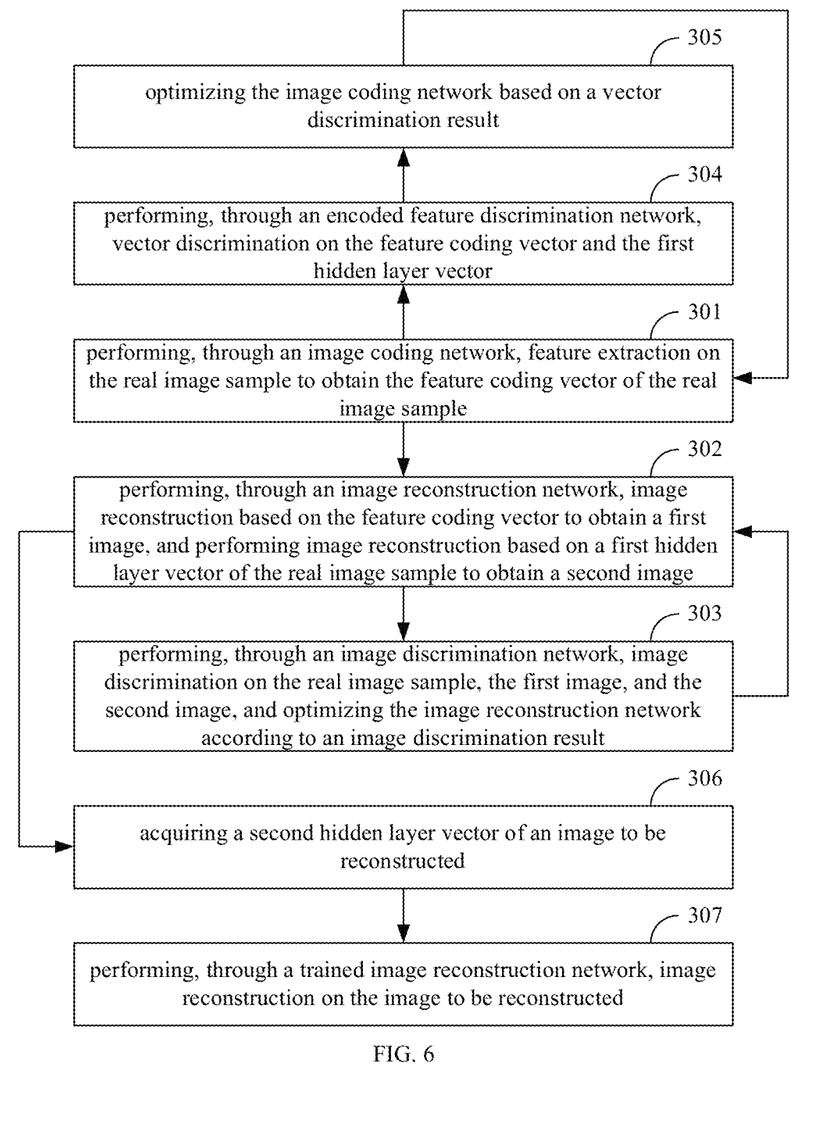
FIG. 6 is a schematic flowchart of a method for reconstructing a medical image provided by another embodiment of the present application.

As shown in FIG. 6, in this embodiment, the method for reconstructing the medical image can comprise steps 301-307.

In step 301, feature coding extraction is performed on a real image sample through an image coding network to obtain a feature coding vector of the real image sample.

In step 302, image reconstruction is performed through an image reconstruction network, based on the feature coding vector to obtain a first image, and image reconstruction is performed based on a first hidden layer vector of the real image sample to obtain a second image.

In step 303, image discrimination is performed on the real image sample, the first image, and the second image through an image discrimination network, and the image reconstruction network is optimized and trained according to an image discrimination result. Herein, the image reconstruction network after being optimized and trained is used as the image reconstruction network in step 302 for performing a next image reconstruction.

In step 304, vector discrimination is performed on the feature coding vector of step 301 and the first hidden layer vector of the real image sample through an encoded feature discrimination network.

In step 305, the image coding network is optimized based on a vector discrimination result. The image coding network after optimization is used as image coding network of step 301 to perform feature extraction on a next real image sample.

In step 306, after the training and optimization of the image reconstruction network by using the real image sample is completed, a second hidden layer vector of an image to be reconstructed is acquired.

In step 307, image reconstruction is performed on the image to be reconstructed through a trained image reconstruction network.

The embodiment of the present application will be described below by taking a real fMRI image of a rat brain region as an example, but are not limited thereto.

First, the real fMRI image $x_{real}$ of the rat brain region can be expanded into three-dimensional images in a time series, and the three-dimensional images are sequentially input into the image coding network. The three-dimensional images are performed with hierarchical feature extraction by using a plurality of three-dimensional convolutional layers of the image coding network, the linear feature and nonlinear feature of the three-dimensional images are synthesized by a linear function, and a feature coding representation vector $z_e$ of the real fMRI image sample is obtained.

Second, both the feature coding vector $z_e$ extracted from the real fMRI image sample and the hidden layer vector $z_r$ sampled from a Gaussian distribution are used as inputs into the image reconstruction network, and fMRI images $x_{rec}$ and $x_{rand}$ are obtained respectively from $z_e$ and $z_r$ by step-by-step reconstruction. The convolution of the image reconstruction network is a three-dimensional separable convolutional layers with nearest neighbor upsampling. The three-dimensional separable convolutional layers with nearest neighbor upsampling are used to replace the deconvolutional layers in the traditional image reconstruction network, which can reduce the number of learnable parameters and improve the quality of the generated fMRI image, so that the reconstruction image has fewer artifacts, clearer structures, etc.

Third, the real fMRI image $x_{real}$, the image $x_{rec}$, and the image $x_{rand}$ are all used as the inputs of the image discrimination network, and the image reconstructor is optimized according to the discrimination result of the image discrimination network, to establish the "generative-adversarial" training. In the meanwhile, an encoded feature discrimination network having the same structure as the image discrimination network is established, and the feature coding vector $z_e$ encoded from the real fMRI image and the hidden layer vector $z_r$ sampled from the Gaussian distribution are used as inputs of the encoded feature discrimination network, such that the encoded feature discrimination network and the image coding network also form the "generative-adversarial" training relationship, so as to replace the variational inference and solve the training conflict between the variational inference and the generative adversarial objective function.

Fourth, an optimal loss function is selected for the training and optimization of the network. In this embodiment, the encoded feature discrimination network is subtly introduced during the training and optimization of the image coding network, so as to replace the conventional variational interference process, which only requires minimizing a voxel-by-voxel difference between the reconstructed fMRI image and the real fMRI image. Moreover, in the present application, the Wasserstein distance is selected as a measurement tool of the real image distribution and the reconstructed image distribution in the loss function, and a gradient penalty term is introduced to crop a discriminator network gradient to further stabilize the network training. For the training of the image reconstructor network, in addition to selecting the Wasserstein distance, a structural similarity metric loss and a perceptual metric loss are further introduced, so as to ensure that features of the reconstructed image in key regions, such as the ventral tegmental area (VTA) and prefrontal cortex (PFC) of the rat, are more consistent with those of the real image. The loss functions of various networks are as follows:

The loss function of the image coding network is as follows:

$L_C = E_{z_e}[C(z_e)] - E_{z_r}[C(z_r)]$,

The loss function of the image discrimination network is as follows:

$L_D = E_{z_e}[D(G(z_e))] + E_{z_r}[D(G(z_r))] - 2E_{x_{real}}[D(x_{real})]$,

The loss function of the image reconstruction network is as follows:

$L_G = -E_{z_e}[D(G(z_e))] - E_{z_r}[D(G(z_r))] + \lambda_1 L_{SSIM}(G(z_r), x_{real}) + \lambda_2 L_{perceptual}(G(z_r), x_{real})$, in which, $L_{SSIM}$ is a structural similarity metric loss function, and $L_{perceptual}$ represents a perceptual metric loss function, which are respectively as follows:

$L_{SSIM} = E_{z_e}[C(z_e)] - E_{z_r}[C(z_r)]$, and $$L_{Perceptual}(G(z_r), x_{real}) = \|G(z_r) - x_{real}\|_2^2 + \sum_{h=1}^{H}\sum_{w=1}^{W} \phi(G(z_r)) - \phi(G(z_r))^2.$$

Finally, the proximity between the reconstructed image and the real image can be evaluated by the SOR technical indicator. After the training and optimization of the image reconstruction network is completed, high-quality medical image samples can be reconstructed from the Gaussian hidden layer vector through the trained image reconstruction network, which facilitates subsequent analysis work.

This embodiment of the present application provides the method for training the medical image reconstruction network that fuses the variational autoencoder and the generative adversarial network. Compared with the conventional generative adversarial network, the method of the present application introduces prior knowledge guidance originated from the real images through the variational autoencoder, thus solving the problem of difficult training of the generative adversarial network.

In this embodiment of the present application, an individual coding discrimination network is added between the variational autoencoder and the generative adversarial network, and aims at replacing the function of the variational inference, such that the coding feature vector of the variational encoder approximates the original Gaussian hidden layer vector in a manner of adversarial training, so as to solve the conflict between variational inference and the objective function of the generative adversarial network.

It should be understood that the sequence numbers of the steps in the above embodiments does not mean the sequence of execution, and the execution sequence of each process should be determined by its function and internal logic, and should not constitute any limitation to the implementation process of the embodiments of the present application.

Figure 7:
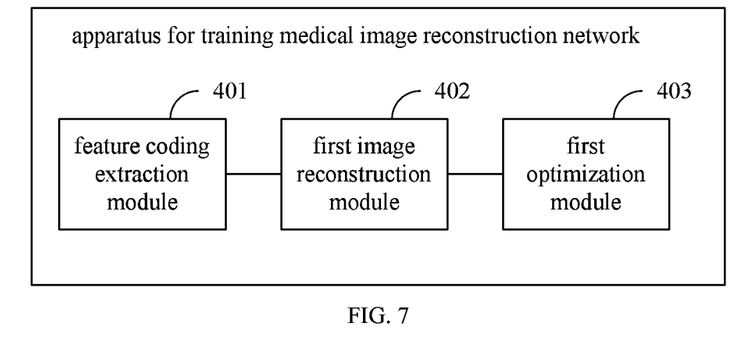
FIG. 7 is a schematic structure diagram of an apparatus for training a medical image reconstruction network provided by another embodiment of the present application.

Corresponding to the method for training the medical image reconstruction network in the above-described embodiments, FIG. 7 illustrates a structural block diagram of an apparatus for training a medical image reconstruction network provided by an embodiment of the present application. For facilitating the description, only those parts related to the embodiments of the present application are shown.

As shown in FIG. 7, an apparatus for training a medical image reconstruction network, comprising: a feature coding extraction module 401, a first image reconstruction module 402, and a first optimization module 403.

The feature coding extraction module 401 is configured for performing feature coding extraction on a real image sample to obtain a feature coding vector of the real image sample;

The first image reconstruction module 402 is configure for performing, through an image reconstruction network, image reconstruction based on the feature coding vector to obtain a first image, and performing image reconstruction based on a first hidden layer vector of the real image sample to obtain a second image.

The first optimization module 403 is configured for performing, through an image discrimination network, image discrimination on the real image sample, the first image, and the second image, and optimizing the image reconstruction network according to an image discrimination result.

Optionally, the feature coding extraction module 401 can be configured for: performing, through an image coding network, feature extraction on the real image sample to obtain the feature coding vector of the real image sample.

Optionally, the feature coding extraction module 401 can be specifically configured for:
performing hierarchical feature extraction on the real image sample through a plurality of three-dimensional convolutional layers of the image coding network; and
processing an extracted feature through a linear function to obtain the feature coding vector of the real image sample.

Optionally, the linear function is a piecewise linear function.

Optionally, the piecewise linear function is a ReLU function.

Optionally, the apparatus for training a medical image reconstruction network further comprises a second optimization module. The second optimization module is configured for:
performing, through an encoded feature discrimination network, vector discrimination on the feature coding vector and the first hidden layer vector; and
optimizing the image coding network based on a vector discrimination result.

Optionally, the operation of optimizing the image coding network based on the vector discrimination result comprises:
performing adversarial training on the image coding network based on the vector discrimination result.

Optionally, the operation of performing the adversarial training on the image coding network based on the vector discrimination result comprises:
calculating a voxel-by-voxel difference between the second image and the real image sample, and updating a network parameter of the image coding network by a gradient descent method until the voxel-by-voxel difference is smaller or equal to a preset threshold;
in which, the voxel-by-voxel difference is a first loss function of the image coding network, and the first loss function is as follows:

$$L_C = E_{z_e}[C(z_e)] - E_{z_r}[C(z_r)],$$

in which, $L_C$ represents the first loss function, $z_e$ represents the feature coding vector, $z_r$ represents the first hidden layer vector, C represents the image coding network, and E represents a mathematical expectation.

Optionally, the first optimization module 403 can be configured for:
performing adversarial training on the image reconstruction network according to the image discrimination result.

Optionally, the operation of performing the adversarial training on the image reconstruction network according to the image discrimination result can comprise:
determining a second loss function of the image reconstruction network according to the image discrimination result, a structural similarity metric loss function, and a perceptual metric loss function, updating the network parameter of the image reconstruction network by the gradient descent method, and training the image reconstruction network;
in which, the second loss function is as follows:

$$L_G = -E_{z_e}[D(G(z_e))] - E_{z_r}[D(G(z_r))] + \lambda_1 L_{SSIM}(G(z_r), x_{real}) + \lambda_2 L_{perceptual}(G(z_r), x_{real}),$$

$$L_{SSIM} = E_{z_e}[C(z_e)] - E_{z_r}[C(z_r)],$$

$$L_{Perceptual}(G(z_r), x_{real}) = \|G(z_r) - x_{real}\|_2^2 + \sum_{h=1}^{H}\sum_{w=1}^{W} \phi(G(z_r)) - \phi(G(z_r))^2,$$

and $$L_D = E_{z_e}[D(G(z_e))] + E_{z_r}[D(G(z_r))] - 2E_{x_{real}}[D(x_{real})],$$

in which, $L_G$ represents the second loss function, $z_e$ represents the feature coding vector, $z_r$ represents the first hidden layer vector, C represents an image coding network, D represents the image discrimination network, G represents the image reconstruction network, E represents a mathematical expectation, $L_{SSIM}$ represents the structural similarity metric loss function, $L_{perceptual}$ represents the perceptual metric loss function, $X_{real}$ represents the real image, $\lambda_1$ and $\lambda_2$ represent weight coefficients, $\Phi$ represents a Gram matrix, and $L_D$ represents a loss function of the image discrimination network.

Optionally, the first image reconstruction module 402 can be specifically configured for:
inputting the feature coding vector and the first hidden layer vector into the image reconstruction network to obtain the first image and the second image; wherein convolutional layers of the image reconstruction network are three-dimensional separable convolutional layers with nearest neighbor upsampling.

Figure 8:
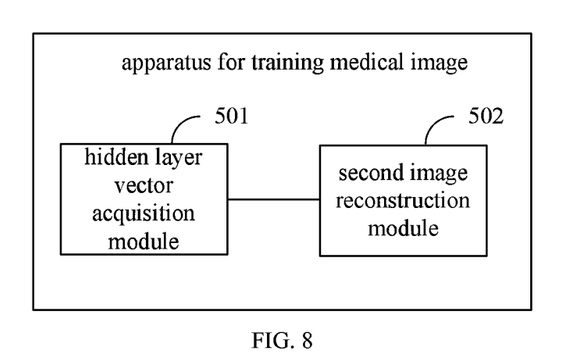
FIG. 8 is a schematic structure diagram of an apparatus for reconstructing a medical image provided by an embodiment of the present application.

Corresponding to the method for reconstructing the medical image in the above-described embodiments, FIG. 8 illustrates a structural block diagram of an apparatus for reconstructing a medical image provided by an embodiment of the present application. For facilitating the description, only those parts related to the embodiments of the present application are shown.

As shown in FIG. 8, an apparatus for training a medical image provided by an embodiment of the present application comprises: a hidden layer vector acquisition module 501 and a second image reconstruction module 502.

The hidden layer vector acquisition module 501 is configured for acquiring a second hidden layer vector of an image to be reconstructed.

The second image reconstruction module 502 is configured for performing, through a trained image reconstruction network, image reconstruction on the image to be reconstructed.

It should be noted that the information exchange between the above apparatus/units, the execution process, and other contents thereof are based on the same concept as the method embodiments of the present application, for the specific function and technical effects, reference may be made to the method embodiments for details, which will not be repeated herein.

Those skilled in the art can clearly understand that, for the convenience and simplicity of description, only the division of the above functional units and modules is used as an example for illustration. In practical applications, the above functions can be allocated to different functional units and modules for implementation, that is, the internal structure of the apparatus are divided into different functional units or modules to complete all or part of the functions as described in above. The various functional units and modules in the embodiments may be integrated into one processing unit, or each of the various units and modules may exist physically alone, or two or more units may be integrated into one unit, and the above-mentioned integrated units may be realized in the form of hardware, as well as in the form of software function units. In addition, the specific names of the functional units and modules are only for the convenience of distinguishing from each other, and are not used to limit the protection scope of the present application. For the specific working processes of the units and modules in the above system, reference may be made to the corresponding processes in the above method embodiments, which will not be repeated here.

Figure 9:
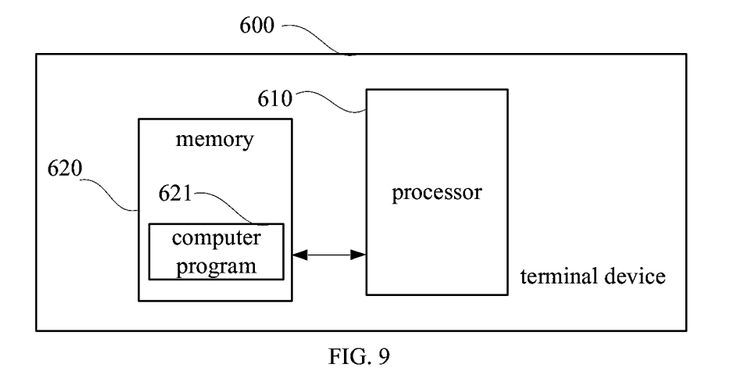
FIG. 9 is a schematic structure diagram of a terminal device provided by an embodiment of the present application.

Embodiments of the present application further provides a terminal device, as shown in FIG. 9, the terminal device 600 can comprise: at least one processor 610, a memory 620, and a computer program stored in the memory 620 and executable on the at least one processor 610. The processor 610 is configured to realize the steps as described in the various method embodiments when executing the computer program, for example, steps 101-103 of the embodiments as shown in FIG. 2, and steps 201-202 of the embodiments as shown in FIG. 5. Or alternatively, the processor 610 is configured to realize functions of the modules/units in the above apparatus embodiments when executing the computer program, for example, the functions of modules 401-403 as shown in FIG. 7, or the functions of modules 501-502 as shown in FIG. 8.

Exemplarily, the computer program may be divided into one or more modules/units, which are stored in the memory 620 and executed by the processor 610 to complete the present application. The one or more modules/units may be a series of computer program segments capable of performing specific functions, and the program segments are used to describe the execution process of the computer program in the terminal device 600.

Those skilled in the art can understand that FIG. 9 is only an example of a terminal device, and does not constitute a limitation on the terminal device. It may include more or less components than those shown in the figure, or combine with some components, or different components, such as input and output devices, network access devices, buses, and the like.

The processor 610 may be a central processing unit (CPU), or other general-purpose processors, digital signal processors (DSP), application specific integrated circuits (ASIC), field-programmable gate array (FPGA), or other programmable logic devices, discrete gate or transistor logic devices, discrete hardware components, etc. A general purpose processor may be a microprocessor, or the processor may be any conventional processor or the like.

The memory 620 may be an internal storage unit of the terminal device, or may be an external storage device of the terminal device, such as a plug-in hard disk, a smart media card (SMC), a secure digital (SD) card, a flash card, and the like. The memory 620 is used to store the computer program and other programs and data required by the terminal device. The memory 620 may also be used to temporarily store data that have been output or will be output.

The buses may be an industry standard architecture (ISA) bus, a peripheral component interconnection (PCI) bus, or an extended industry standard architecture (EISA) bus, or the like. The buses can be divided into an address bus, a data bus, a control bus and the like. For convenience of representation, the buses in the drawings of the present application are not limited to only one bus or one type of buses.

An embodiment of the present application further provides a computer-readable storage medium. The computer-readable storage medium stores a computer program, and when the computer program is executed by a processor, causes the processor to implement the steps of various embodiments of the method for training the medical image reconstruction network, or to implement the steps of various embodiments of the method for reconstructing the medical image.

The embodiments of the present application provide a computer program product, when the computer program product runs on a mobile terminal, enables the mobile terminal to implement the steps of various embodiments of the method for training the medical image reconstruction network, or to implement the steps of various embodiments of the method for reconstructing the medical image.

The integrated unit, if implemented in the form of a software functional unit and sold or used as an independent product, may be stored in a computer-readable storage medium. Based on this understanding, all or part of the processes in the methods of the above embodiments implemented in the present application can be completed by instructing the relevant hardware through a computer program, and the computer program can be stored in a computer-readable storage medium. When the computer program is executed by a processor, the steps of the above various method embodiments can be implemented. The computer program includes computer program code, and the computer program code may be in the form of source code, object code, executable file or some intermediate form, and the like. The computer-readable medium may include at least: any entity or apparatus, recording medium, computer memory, read-only memory (ROM), random access memory (RAM), electrical carrier signals, telecommunication signals, and software distribution media capable of carrying the computer program code to the photographing apparatus/terminal device. For example, U disk, mobile hard drive, disk or CD, etc. In some jurisdictions, under legislation and patent practice, computer readable media may not be electrical carrier signals and telecommunications signals.

In the foregoing embodiments, the description of each embodiment has its own emphasis. For parts that are not described or described in detail in a certain embodiment, reference may be made to the relevant descriptions of other embodiments.

Those skilled in the art can realize that the units and algorithm steps of each example described in conjunction with the embodiments disclosed herein can be implemented in electronic hardware, or a combination of computer software and electronic hardware. Whether these functions are performed in hardware or software depends on the specific application and design constraints of the technical solution. Skilled artisans may implement the described functionality using different methods for each particular application, but such implementations should not be considered beyond the scope of the present application.

In the embodiments provided in this application, on the one hand, it should be understood that the disclosed apparatus/network device and method may be implemented in other manners. For example, the apparatus/network device embodiments described above are only illustrative. For example, the division of the modules or units is only a logical function division. In actual implementation, other division methods may be adopted, for example multiple units or components may be combined or may be integrated into another system, or some features may be omitted, or not implemented. On the other hand, the shown or discussed mutual coupling or direct coupling or communication connection may be through some interfaces, indirect coupling or communication connection of devices or units, and may be in electrical, mechanical, or other forms.

The units described as separate components may or may not be physically separated, and components displayed as units may or may not be physical units, that is, may be located in one place, or may be distributed to multiple network units. Some or all of the units may be selected according to actual needs to achieve the purpose of the solutions of these embodiments.

The above-mentioned embodiments are only used to illustrate, rather than to limit, the technical solutions of the present application. Although the present application has been described in detail with reference to the above-mentioned embodiments, those skilled in the art should understand that: the technical solutions described in the forgoing various embodiments can also be modified, or some technical features thereof can be equivalently replaced. These modifications or replacements do not make the essence of the corresponding technical solutions deviate from the spirit and scope of the technical solutions in embodiments of the present application, and should be included within the protection scope of the present application.

What is claimed is:

1. A method for training a medical image reconstruction network, being applied to a server, and the method comprising:
performing feature coding extraction on a real image sample to obtain a feature coding vector of the real image sample;
performing, through an image reconstruction network, image reconstruction based on the feature coding vector to obtain a first image, and performing image reconstruction based on a first hidden layer vector of the real image sample to obtain a second image; and
performing, through an image discrimination network, image discrimination on the real image sample, the first image, and the second image to obtain a loss function of the image discrimination network, a structural similarity metric loss function, and a perceptual metric loss function, and optimizing the image reconstruction network according to the loss function of the image discrimination network, the structural similarity metric loss function, and the perceptual metric loss function;
wherein
the step of optimizing the image reconstruction network according to the loss function of the image discrimination network, the structural similarity metric loss function, and the perceptual metric loss function comprises:
performing adversarial training on the image reconstruction network according to the loss function of the image discrimination network, the structural similarity metric loss function, and the perceptual metric loss function, which comprises:
determining a second loss function of the image reconstruction network according to the loss function of the image discrimination network, the structural similarity metric loss function, and the perceptual metric loss function, updating a network parameter of the image reconstruction network by a gradient descent method, and training the image reconstruction network;
wherein, the second loss function is as follows:

$$L_G = -E_{z_e}[D(G(z_e))] - E_{z_r}[D(G(z_r))] + \lambda_1 L_{SSIM}(G(z_r), x_{real}) + \lambda_2 L_{perceptual}(G(z_r), x_{real}),$$

$$L_{SSIM} = E_{z_e}[C(z_e)] - E_{z_r}[C(z_r)],$$

$$L_{Perceptual}(G(z_r), x_{real}) = \|G(z_r) - x_{real}\|_2^2 + \sum_{h=1}^{H}\sum_{w=1}^{W} \phi(G(z_r)) - \phi(G(z_r)))^2,$$

and $$L_D = E_{z_e}[D(G(z_e))] + E_{z_r}[D(G(z_r))] - 2E_{x_{real}}[D(x_{real})],$$

in which, $L_G$ represents the second loss function, $z_e$ represents the feature coding vector, $z_r$ represents the first hidden layer vector, C represents an image coding network, D represents the image discrimination network, G represents the image reconstruction network, E represents a mathematical expectation, $L_{SSIM}$ represents the structural similarity metric loss function, $L_{perceptual}$ represents the perceptual metric loss function, $X_{real}$ represents a real image, $\lambda_1$ and $\lambda_2$ represent weight coefficients, $\Phi$ represents a Gram matrix, and $L_D$ represents the loss function of the image discrimination network.

2. The method for training a medical image reconstruction network according to claim 1, wherein the step of performing feature coding extraction on the real image sample to obtain the feature coding vector of the real image sample comprises:
performing, through an image coding network, feature extraction on the real image sample to obtain the feature coding vector of the real image sample.

3. The method for training a medical image reconstruction network according to claim 2, wherein the step of performing, through the image coding network, feature extraction on the real image sample to obtain the feature coding vector of the real image sample comprises:
  performing hierarchical feature extraction on the real image sample through a plurality of three-dimensional convolutional layers of the image coding network; and
  processing an extracted feature through a linear function to obtain the feature coding vector of the real image sample.

4. The method for training a medical image reconstruction network according to claim 3, wherein the linear function is a piecewise linear function.

5. The method for training a medical image reconstruction network according to claim 4, wherein the piecewise linear function is a ReLU function.

6. The method for training a medical image reconstruction network according to claim 1, wherein the step of performing, through the image reconstruction network, image reconstruction based on the feature coding vector to obtain the first image, and performing image reconstruction based on the first hidden layer vector of the real image sample to obtain the second image, comprises:
  inputting the feature coding vector and the first hidden layer vector into the image reconstruction network to obtain the first image and the second image; wherein convolutional layers of the image reconstruction network are three-dimensional separable convolutional layers with nearest neighbor upsampling.

7. A method for reconstructing a medical image, being applied to a server, and the method comprising:
  acquiring a second hidden layer vector of an image to be reconstructed; and
  performing, through a trained image reconstruction network, image reconstruction on the image to be reconstructed;
  wherein
    the trained image reconstruction network is obtained by a method for training a medical image reconstruction network, and the method for training the medical image reconstruction network comprises:
    performing feature coding extraction on a real image sample to obtain a feature coding vector of the real image sample;
    performing, through an image reconstruction network, image reconstruction based on the feature coding vector to obtain a first image, and performing image reconstruction based on a first hidden layer vector of the real image sample to obtain a second image; and
    performing, through an image discrimination network, image discrimination on the real image sample, the first image, and the second image to obtain a loss function of the image discrimination network, a structural similarity metric loss function, and a perceptual metric loss function, and optimizing the image reconstruction network according to the loss function of the image discrimination network, the structural similarity metric loss function, and the perceptual metric loss function;
    wherein
      the step of optimizing the image reconstruction network according to the loss function of the image discrimination network, the structural similarity metric loss function, and the perceptual metric loss function comprises:
        performing adversarial training on the image reconstruction network according to the loss function of the image discrimination network, the structural similarity metric loss function, and the perceptual metric loss function, which comprises:
          determining a second loss function of the image reconstruction network according to the loss function of the image discrimination network, the structural similarity metric loss function, and the perceptual metric loss function, updating a network parameter of the image reconstruction network by a gradient descent method, and training the image reconstruction network;
        wherein, the second loss function is as follows:

$$L_G = -E_{z_e}[D(G(z_e))] - E_{z_r}[D(G(z_r))] + \lambda_1 L_{SSIM}(G(z_r), x_{real}) + \lambda_2 L_{perceptual}(G(z_r), x_{real}),$$

$$L_{SSIM} = E_{z_e}[C(z_e)] - E_{z_r}[C(z_r)],$$

$$L_{Perceptual}(G(z_r), x_{real}) = \|G(z_r) - x_{real}\|_2^2 + \sum_{h=1}^{H}\sum_{w=1}^{W} \phi(G(z_r)) - \phi(G(z_r))^2,$$

and $$L_D = E_{z_e}[D(G(z_e))] + E_{z_r}[D(G(z_r))] - 2E_{x_{real}}[D(x_{real})],$$

in which, $L_G$ represents the second loss function, $z_e$ represents the feature coding vector, $z_r$ represents the first hidden layer vector, C represents an image coding network, D represents the image discrimination network, G represents the image reconstruction network, E represents a mathematical expectation, $L_{SSIM}$ represents the structural similarity metric loss function, $L_{perceptual}$ represents the perceptual metric loss function, $X_{real}$ represents a real image, $\lambda_1$ and $\lambda_2$ represent weight coefficients, $\Phi$ represents a Gram matrix, and $L_D$ represents the loss function of the image discrimination network.

8. A terminal device, comprising: a memory, a processor, and computer-readable instructions stored in the memory and executable on the processor; wherein the processor is configured to implement the following steps when executing the computer-readable instructions:
  performing feature coding extraction on a real image sample to obtain a feature coding vector of the real image sample;
  performing, through an image reconstruction network, image reconstruction based on the feature coding vector to obtain a first image, and performing image reconstruction based on a first hidden layer vector of the real image sample to obtain a second image; and
  performing, through an image discrimination network, image discrimination on the real image sample, the first image, and the second image to obtain a loss function of the image discrimination network, a structural similarity metric loss function, and a perceptual metric loss function, and optimizing the image reconstruction network according to the loss function of the image discrimination network, the structural similarity metric loss function, and the perceptual metric loss function;
  wherein
    the step of optimizing the image reconstruction network according to the loss function of the image discrimination network, the structural similarity metric loss function, and the perceptual metric loss function comprises:
      performing adversarial training on the image reconstruction network according to the loss function of the image discrimination network, the structural similarity metric loss function, and the perceptual metric loss function, which comprises:

determining a second loss function of the image reconstruction network according to the loss function of the image discrimination network, the structural similarity metric loss function, and the perceptual metric loss function, updating a network parameter of the image reconstruction network by a gradient descent method, and training the image reconstruction network;

wherein, the second loss function is as follows:

$$L_G = -E_{z_e}[D(G(z_e))] - E_{z_r}[D(G(z_r))] + \lambda_1 L_{SSIM}(G(z_r), x_{real}) + \lambda_2 L_{perceptual}(G(z_r), x_{real}),$$

$$L_{SSIM} = E_{z_e}[C(z_e)] - E_{z_r}[C(z_r)],$$

$$L_{Perceptual}(G(z_r), x_{real}) = \|G(z_r) - x_{real}\|_2^2 + \sum_{h=1}^{H}\sum_{w=1}^{W} \phi(G(z_r)) - \phi(G(z_r))^2,$$

and $$L_D = E_{z_e}[D(G(z_e))] + E_{z_r}[D(G(z_r))] - 2E_{x_{real}}[D(x_{real})],$$

in which, $L_G$ represents the second loss function, $z_e$ represents the feature coding vector, $z_r$ represents the first hidden layer vector, C represents an image coding network, D represents the image discrimination network, G represents the image reconstruction network, E represents a mathematical expectation, $L_{SSIM}$ represents the structural similarity metric loss function, $L_{perceptual}$ represents the perceptual metric loss function, $X_{real}$ represents a real image, $\lambda_1$ and $\lambda_2$ represent weight coefficients, $\Phi$ represents a Gram matrix, and $L_D$ represents the loss function of the image discrimination network.

9. The terminal device according to claim 8, wherein the step of performing feature coding extraction on the real image sample to obtain the feature coding vector of the real image sample comprises:

performing, through an image coding network, feature extraction on the real image sample to obtain the feature coding vector of the real image sample.

10. The terminal device according to claim 9, wherein the step of performing, through the image coding network, feature extraction on the real image sample to obtain the feature coding vector of the real image sample comprises:

performing hierarchical feature extraction on the real image sample through a plurality of three-dimensional convolutional layers of the image coding network; and processing an extracted feature through a linear function to obtain the feature coding vector of the real image sample.

11. The terminal device according to claim 10, wherein the linear function is a ReLU function.

* * * * *